(12) United States Patent
Clevenger et al.

(10) Patent No.: US 9,362,230 B1
(45) Date of Patent: Jun. 7, 2016

(54) METHODS TO FORM CONDUCTIVE THIN FILM STRUCTURES

(71) Applicant: GLOBALFOUNDRIES INC., Grand Cayman (KY)

(72) Inventors: Lawrence A. Clevenger, LaGrangeville, NY (US); Vincent J. McGahay, Poughkeepsie, NY (US); Joyeeta Nag, Wappingers Falls, NY (US); Yiheng Xu, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/722,302

(22) Filed: May 27, 2015

(51) Int. Cl.
| | |
|---|---|
| *H01L 21/265* | (2006.01) |
| *H01L 23/532* | (2006.01) |
| *H01L 21/285* | (2006.01) |
| *H01L 21/3213* | (2006.01) |
| *H01L 21/768* | (2006.01) |
| *H01L 23/528* | (2006.01) |

(52) U.S. Cl.
CPC .... *H01L 23/53238* (2013.01); *H01L 21/26566* (2013.01); *H01L 21/28556* (2013.01); *H01L 21/32136* (2013.01); *H01L 21/7685* (2013.01); *H01L 21/76892* (2013.01); *H01L 23/528* (2013.01)

(58) Field of Classification Search
CPC ............... H01L 23/53238; H01L 21/28556; H01L 21/32136; H01L 21/26566; H01L 21/76892; H01L 21/7685; H01L 23/528
See application file for complete search history.

(56) References Cited

U.S. PATENT DOCUMENTS

| | | | |
|---|---|---|---|
| 7,314,786 B1 | 1/2008 | Yang et al. | |
| 7,709,344 B2 | 5/2010 | Chen et al. | |
| 7,745,324 B1 | 6/2010 | Yang et al. | |
| 2008/0290416 A1 | 11/2008 | Yu et al. | |
| 2012/0037999 A1 | 2/2012 | Jagannathan et al. | |
| 2014/0141590 A1 | 5/2014 | Smythe, III et al. | |

*Primary Examiner* — Long Pham
(74) *Attorney, Agent, or Firm* — Thompson Hine LLP

(57) ABSTRACT

Electrically conductive structures and methods of making electrically conductive structures. The methods include providing a dielectric layer of a material having a top surface and a dielectric constant of less than 3; rastering a gas cluster ion beam to form a patterned modified surface region of the top surface of the dielectric layer; and selectively forming an electrically conductive thin film on the patterned modified surface region using atomic layer deposition.

20 Claims, 4 Drawing Sheets

METHODS TO FORM CONDUCTIVE THIN FILM STRUCTURES

BACKGROUND

The present invention relates to the field of integrated circuits; more specifically, it relates to methods to form conductive thin film structures on integrated circuits without using masks to form the structures.

The formation of thin film structures is difficult to integrate into damascene technology because of metal dishing during the chemical-mechanical polish step of the damascene process causing thickness variation in the conductive thin film structure across the chip and wafer. While subtractive etch processes may be used to form conductive thin film structures, such an approach requires additional etch masks and adds additional cost. Accordingly, there exists a need in the art to eliminate the deficiencies and limitations described hereinabove.

BRIEF SUMMARY

A first aspect of the present invention is a method, comprising: providing a dielectric layer of a material having a top surface and a dielectric constant of less than 3; rastering a gas cluster ion beam to form a patterned modified surface region of the top surface of the dielectric layer; and selectively forming an electrically conductive thin film on the patterned modified surface region using atomic layer deposition.

A second aspect of the present invention is a structure, comprising: a dielectric layer of a material having a top surface and a dielectric constant of less than 3; a chemically or mechanically modified region of the top surface of the dielectric layer; and an electrically conductive thin film on the chemically or mechanically modified region.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The embodiments of the present invention allow formation of conductive thin film structures including passive devices such as resistors and capacitors without the use of photomasks or subtractive etching. A GCIB is used to raster scan a pattern on to the surface of a dielectric material and then a selective Atomic Layer Deposition (ALD) is used to form a thin conductive film only over those regions of the dielectric surface that have been previously treated with the GCIB process.

GCIB is a technology for nano-scale modification of surfaces. It can smooth a surface to within an angstrom of roughness without sub-surface damage as well as chemically alter the surface through infusion or deposition. Using GCIB, a surface is bombarded by a beam of high energy nanoscale ion clusters. The clusters are formed by adiabatic expansion of a gas into nano-sized particles. The clusters are ionized, accelerated electrostatically, focused into a beam that can be deflected electrostatic to generate a pattern on the surface of a target substrate. Examples of gases suitable for GCIB include carbon containing molecules such as carbon dioxide ($CO_2$) and molecules of argon (Ar) and nitrogen ($N_2$).

ALD is a thin film deposition process in which a film is grown on a substrate by exposing its surface to pulses of alternate gaseous species (typically referred to as a precursor) in a series of sequential non-overlapping pulses with a purge between precursors. In each pulse, the precursor reacts with surface in a self-limiting manner, so the reaction terminates once all reactive sites on the surface are used up. Typically, a species A is deposited followed by species B which reacts with species A immediately previously deposited. The next deposition of species B reacts with the species A previously deposited and so on through a series of A-purge-B-purge-A-purge-B . . . etc. pulses. The reaction is A+B→Product. The reaction requires an activation energy. In a type of ALD known as thermal ALD (tALD), the activation energy is supplied by heating the substrate.

Figure 1A:
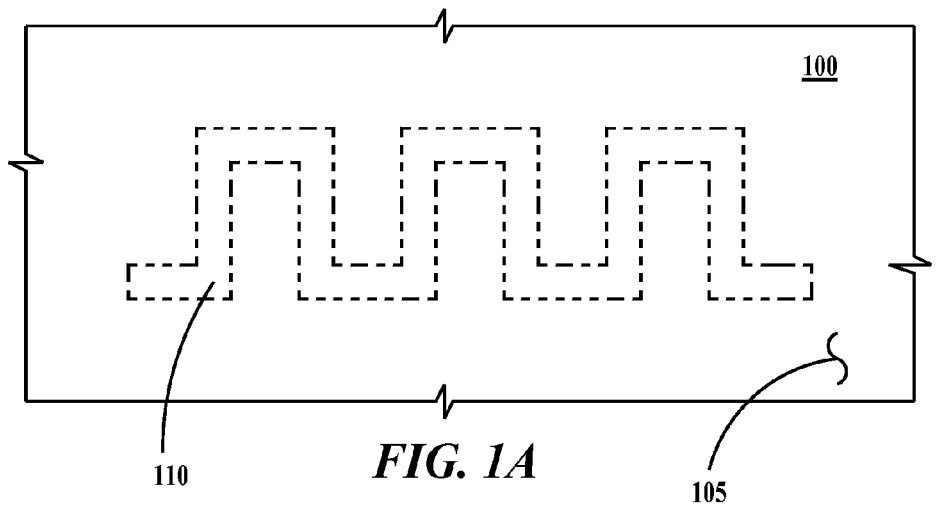
FIGS. 1A and 1B are top views and FIG. 1C is a cross-section through line 1C-1C of FIG. 1B illustrating a method to form a thin film on and dielectric according to an embodiment of the present invention.
Figure 1B:
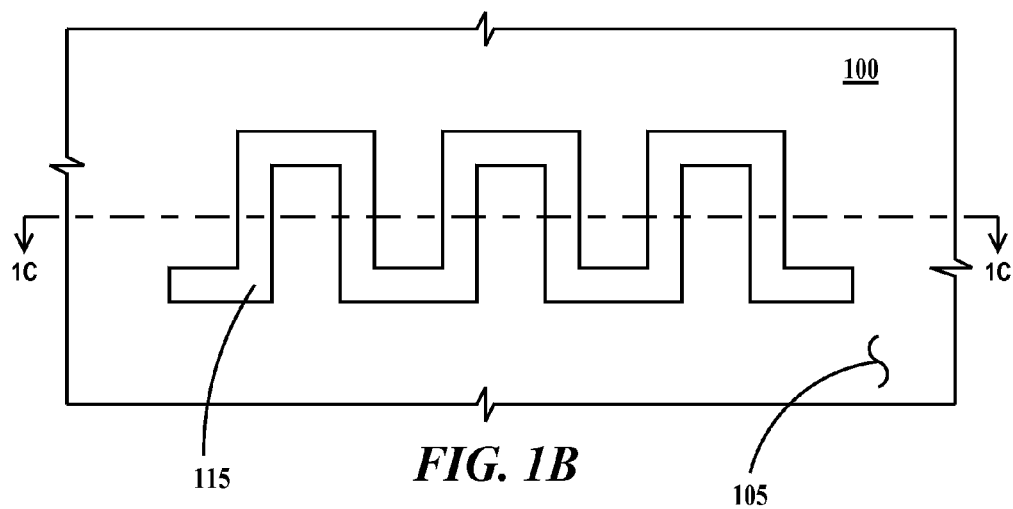
Figure 1C:
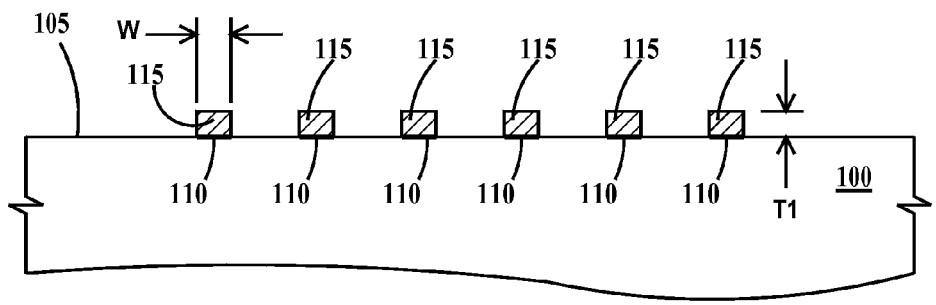

FIGS. 1A and 1B are top views and FIG. 1C is a cross-section through line 1C-1C of FIG. 1B illustrating a method to form a thin film on and dielectric according to an embodiment of the present invention. In FIG. 1A, a dielectric layer 100 has a top surface 105. A surface modified region 110 has been formed (dashed lines) in a serpentine pattern by raster scanning a GCIB. In one example, dielectric layer 100 is a low K (dielectric constant) material or an ultra low K (ULK) material. In one example, dielectric layer 100 is a low K material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) organosilicate glass (SiCOH), and porous SiCOH. In one example, dielectric layer 100 is a ULK material, examples of which include but are not limited to porous hydrogen silsesquioxane polymer (HSQ), porous methyl silsesquioxane polymer (MSQ), porous (methyl doped silica or $SiO_x(CH_3)_y$ or $SiC_xO_yH_y$ or SiOCH), octametylcyclotetrailoxane (OMCTS) based materials and tetrametylcyclotetrailoxane (TMCTS) based materials. A low K dielectric material has a relative permittivity of between 3.0 and 2.4. A ULK dielectric material has a relative permittivity of 2.4 or less. In one example, dielectric layer 100 is ULK SiCOH. In one example, the GCIB uses $CO_2$ with of average cluster size of 10,000 atoms, average cluster charge of +3, average cluster energy of 65 KeV and total current of 200 µA.

In FIG. 1B, a serpentine tantalum nitride (TaN) layer 115 has been formed by selective deposition of TaN using tALD only on surface modified region 110 of FIG. 1A. No deposition of TaN occurs on regions of surface 105 that have not been modified by GCIB. See discussion infra relative to FIG.

3. In one example, the tALD uses a Ta halide and a nitrogen containing species as the alternative precursors at a temperature between 200° and 800° C. to deposit TaN. In one example, the tALD uses $TaCl_4$ and $NH_3$ as the alternative precursors at a temperature of 300° C. or lower to deposit TaN.

In FIG. 1C, TaN 115 layer has a thickness T1 and the serpentine pattern has a width of W. In one example, T1 is between 5 Å and 50 Å. In one example, T1 is between 5 Å and 20 Å. In one example, T1 is between 20 Å and 50 Å. In one example, W is between 5 nm and 5 µm.

Figure 2A:
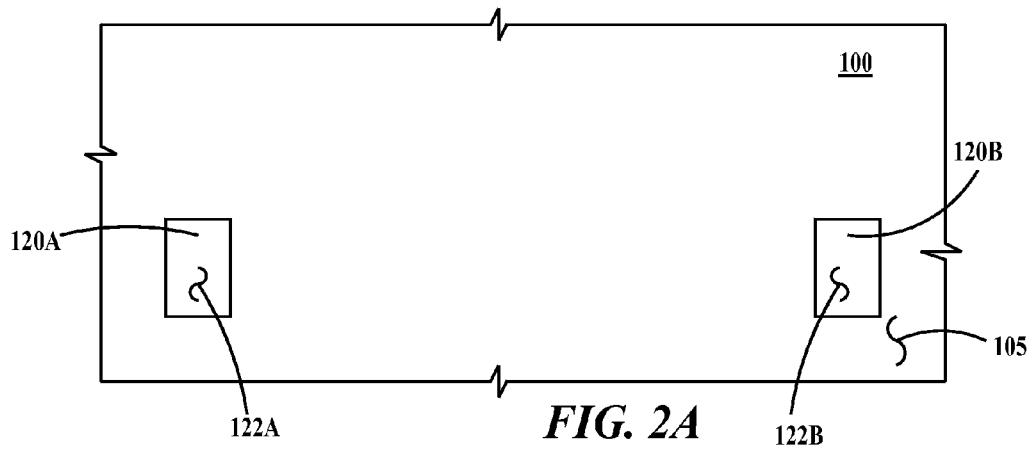
FIGS. 2A, 2B and 2C are top views
Figure 2B:
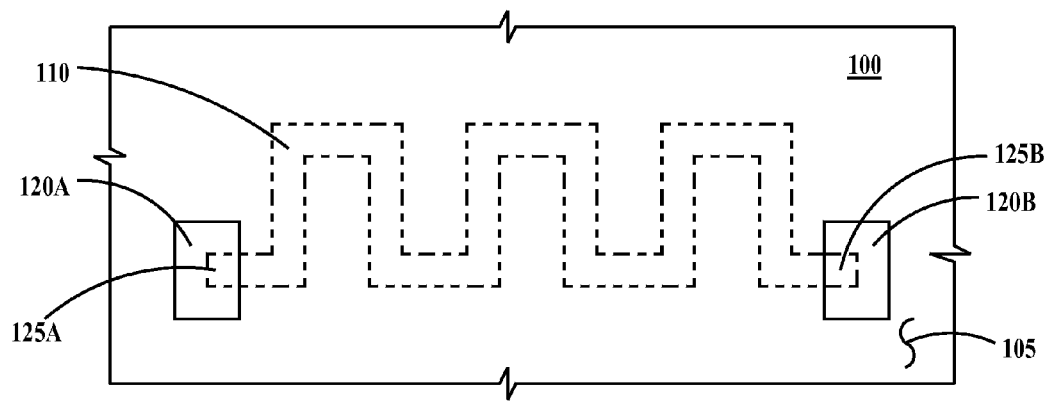
Figure 2C:
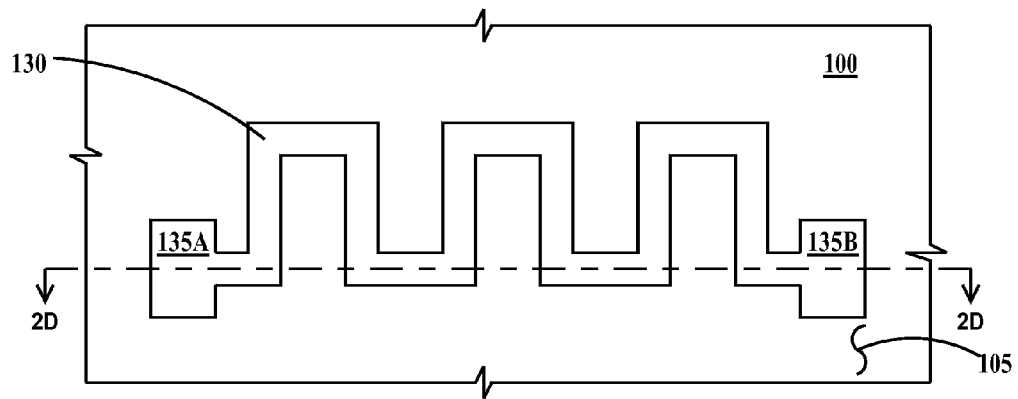
Figure 2D:
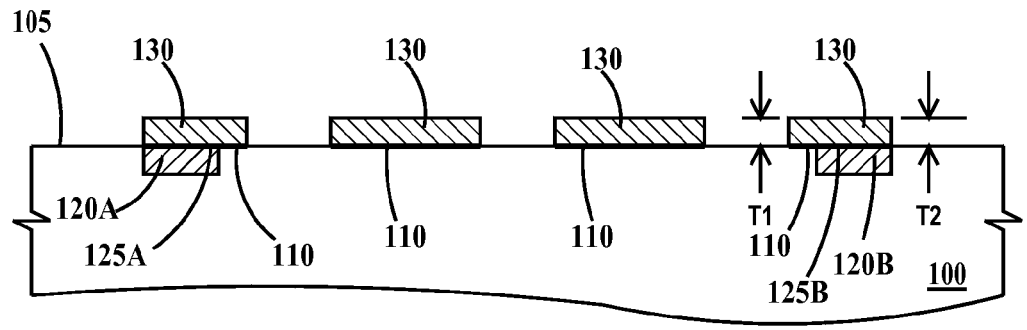
FIG. 2D is a cross-section through line 2D-2D of FIG. 2CB illustrating a method to form a thin film resistor connected to a damascene wire in an interlevel dielectric layer according to an embodiment of the present invention.

FIGS. 2A, 2B and 2C are top views and FIG. 2D is a cross-section through line 2D-2D of FIG. 2C illustrating a method to form a thin film resistor connected to a damascene wire in an interlevel dielectric layer according to an embodiment of the present invention. In FIG. 2A a damascene or dual-damascene first copper wire 120A and a damascene or dual-damascene second copper wire 120B have been formed in dielectric layer 105. The top surface 122A of first contact 120A and the top surface 122B of second contact 120B are coplanar with top surface 105 of dielectric layer 100. A damascene process is one in which wire trenches or via openings are formed in a dielectric layer, an electrical conductor of sufficient thickness to fill the trenches is formed in the trenches and on a top surface of the dielectric. A chemical-mechanical-polish (CMP) process is performed to remove excess conductor from the surface of the dielectric layer and make the surface of the conductor co-planar with the top surface of the dielectric layer to form damascene wires (or damascene vias). When only a trench and a wire (or a via opening and a via) is formed the process is called single-damascene or simply damascene. When an upper wire and integral lower via are formed the process is called dual-damascene.

In FIG. 2B, the GCIB process has not only formed modified surface region 110 but the raster has been extended to include first surface modified region 125A on first copper wire 120A and second surface modified region 125B on copper wire 120B. Surface modified region 110, first surface modified region 125A and second modified region 125B are contiguous.

In FIG. 2C, a serpentine TaN layer 130 has been formed by selective deposition of TaN using tALD only on the surface modified region 110, the first surface modified region 120A and the second surface modified region 120B of FIG. 2B. No deposition of TaN occurs on regions of surface 105 that have not been modified by GCIB. The resultant structure includes a TaN resistor having integral contact pads 135A and 135B.

In FIG. 2D, TaN layer 130 has a thickness T2 over first copper wire 120A and over second copper wire 120B. TaN layer 130 has thickness T1 as discussed supra, over dielectric layer 100. In one example, T2 is between 5 Å and 50 Å. In one example, T2 is between 5 Å and 20 Å. It is the thinness of TaN layer 130 that makes in suitable for use as a resistor (or for use as a fusible link). Thickness T1 and Thickness T2 are substantially the same; for example, within about 20% of each other or within about 5 Å of each other. The similarity of deposition rates of tALD TaN over low L, ULK and copper is a feature of the embodiments of the present invention that aid in integrating structures described hereinto into integrated circuit chips by reducing the possibility of defects in the TaN layer. See discussion infra relative to FIG. 4.

An optional GCIB process step may be performed between FIGS. 2B and 2C, namely an Ar or $N_2$ GCIB to remove any copper oxide formed from the of the copper wires where the serpentine GCIB overlapped the wires. This optional GCIB may be performed using Ar or $N_2$.

Figure 3:
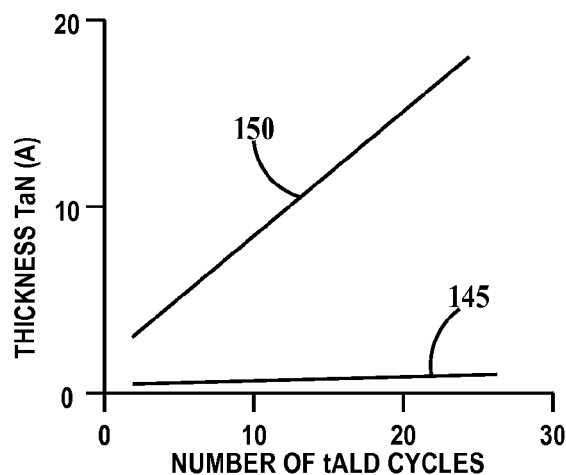
FIG. 3 is a plot of the number of tALD cycles vs. the thickness of a TaN film for a Gas Cluster Ion Beam (GCIB) treated dielectric surface and non-GCIB treated dielectric surface.

FIG. 3 is a plot of the number of tALD cycles vs. the thickness of a TaN film for a GCIB treated dielectric surface and non-GCIB treated dielectric surface. In FIG. 3, curve 145 plots the thickness of tALD TaN as a function of the number of tALD cycles on an untreated (not treated by GCIB) ULK SiCOH dielectric layer while curve 150 plots the thickness of tALD TaN as a function of the number of tALD cycles on the same ULK SiCOH dielectric layer except a $CO_2$ GCIB treatment has been performed. There is very little (less than 2 Å) of TaN deposited after over 20 tALD cycles, but on the $CO_2$ GCIB treated ULK SiCOH there is 12 Å of TaN after 20 tALD cycles and 20 Å of TaN after 30 tALD cycles. Thus, there is essentially no significant TaN deposition without a GCIB pretreatment. The fact that GCIB pretreatment increases the TaN deposition rate is an unexpected result.

Figure 4:
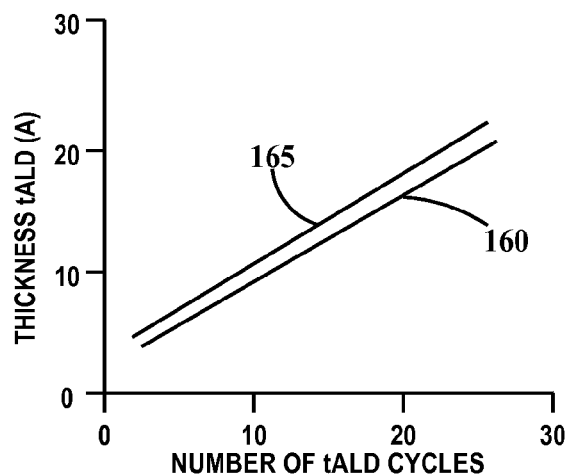
FIG. 4 is a plot of the number of tALD cycles vs. the thickness of a TaN film for a GCIB treated dielectric surface and a copper surface.

FIG. 4 is a plot of the number of tALD cycles vs. the thickness of a TaN film for a GCIB treated dielectric surface and a copper (Cu) surface. In FIG. 4, curve 160 plots the thickness of tALD TaN as a function of the number of tALD cycles on a $CO_2$ GCIB treated ULK SiCOH dielectric layer while curve 165 plots the thickness of tALD TaN as a function of the number of tALD cycles on a copper layer with the same $CO_2$ GCIB treatment. There is very little (less than 2-3 Å or about 10%) TaN thickness and deposition rate difference in on GCIB treated dielectric and copper after 30 tALD cycles. It was also found that there was a significant difference in TaN thickness and deposition rate (10 Å or about 40%) when plasma enhanced ALD (PEALD) was used to deposit TaN. Thus, the $CO_2$ GCIB treatment in combination with tALD TaN results in similar deposition rates of TaN on ULK SiCOH and TaN on Cu. The fact that GCIB pretreatment in combination with tALD TaN results in increases the TaN deposition rate similar deposition rates of TaN on ULK SiCOH and TaN on Cu is an unexpected result.

Figure 5:
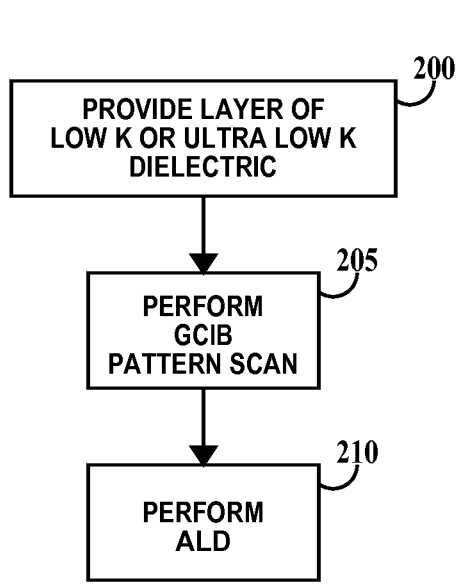
FIG. 5 is a flowchart of a method of forming a thin film according to an embodiment of the present invention.

FIG. 5 is a flowchart of a method of forming a thin film according to an embodiment of the present invention. In step 200 a layer of low K or ULK dielectric is provided. Examples of low-K or ULK dielectrics have been provided supra. In step 205, a GCIB pattern scan is performed. This step is critical to the embodiments of the present invention. Examples of GCIB processes have been provide supra. In step 210, an ALD conductive layer deposition is performed. One or more ALD cycles are performed. Examples of ALD and materials (TaN and tALD) have been provided supra. Other examples of ALD include PEALD and other ALD deposited materials include Ta, titanium (Ti), germanium (Ge), ruthenium (Ru) and platinum (Pt) and titanium nitride (TiN).

Figure 6:
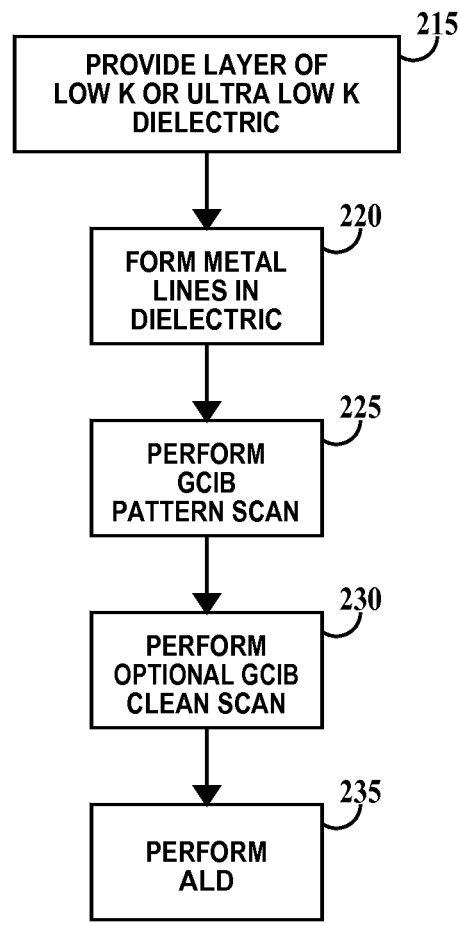
FIG. 6 is a flowchart of a method of forming a thin film resistor according to an embodiment of the present invention.

FIG. 6 is a flowchart of a method of forming a thin film resistor according to an embodiment of the present invention. In step 215 a layer of low K or ULK dielectric is provided. Examples of low-K or ULK dielectrics have been provided supra. In step 220, metal lines are formed on the surface of the dielectric layer (e.g., by subtractive etching) or in the dielectric layer using a damascene process so only the top surface of the metal lines are exposed. In step 225, a GCIB pattern scan is performed. The pattern scan overlaps regions of or the entire surface of some or all of the metal lines. This step (not necessarily including the overlap) is critical to the embodiments of the present invention. In step 230 an optional GCIB clean scan of regions of the metal lines previously exposed to the CGCIB scan of step 225. Examples of GCIB processes have been provide supra. In step 235 an ALD conductive layer deposition is performed as in step 210 of FIG. 5. One or more ALD cycles are performed.

The embodiments of the present invention were illustrated using a serpentine structure that may be used as a resistor. A straight wire may also be used as a resistor. A straight wire may also be used as a fuse.

Thus, the present invention provides methods to form thin conductive film structures on integrated circuits such as resistors and capacitors and fuses without using masks to form the structures or subtractive etching to form the structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a dielectric layer of a material having a top surface and a dielectric constant of less than 3;
   rastering a gas cluster ion beam to form a patterned modified surface region of said top surface of said dielectric layer; and
   selectively forming an electrically conductive thin film on said patterned modified surface region using atomic layer deposition.

2. The method of claim 1, wherein said electrically conductive thin film deposits only on said patterned modified surface region.

3. The method of claim 1, wherein said gas cluster ion beam utilizes carbon dioxide as the gas for generating gas clusters.

4. The method of claim 1, wherein said atomic layer deposition is a thermal atomic layer deposition.

5. The method of claim 1, wherein said atomic layer deposition deposits tantalum nitride.

6. The method of claim 1, wherein said atomic layer deposition is a thermal atomic layer deposition and deposits tantalum nitride.

7. The method of claim 1, further comprising:
   forming copper wires embedded in said top surface of said dielectric layer, top surfaces of said wire coplanar with said top surface of said dielectric layer; and
   wherein said electrically conductive thin film also deposits on said top surfaces of said copper wires.

8. The method of claim 7, wherein the difference in deposition rate of said conductive thin film on said patterned modified surface region and the deposition rate of said conductive thin film on said copper wires is 10% or less.

9. The method of claim 7, wherein said conductive thin film is TaN formed by thermal atomic layer deposition.

10. The method of claim 1, further comprising:
    forming copper wires embedded in said top surface of said dielectric layer, top surfaces of said wire coplanar with said top surface of said dielectric layer;
    wherein and said patterned modified surface region overlaps regions of said top surfaces of said copper wires; and
    wherein said electrically conductive thin film also deposits on said top surfaces of said copper wires.

11. The method of claim 10, wherein the difference in deposition rate of said conductive thin film on said patterned modified surface region and the deposition rate of said conductive thin film on said copper wires is 10% or less.

12. The method of claim 10, wherein said conductive thin film is TaN formed by thermal atomic layer deposition.

13. The method of claim 10, wherein said gas cluster ion beam utilizes carbon dioxide as the gas for generating gas clusters.

14. The method of claim 10, further comprising:
    after said rastering gas cluster ion beam to form a patterned modified surface region of said top surface of said dielectric layer and before said selectively forming an electrically conductive thin film on said patterned modified surface region using atomic layer deposition, performing an additional gas rastering gas cluster ion beam with a gas different from the gas used in said rastering gas cluster ion beam to form said patterned modified surface region of said top surface of said dielectric layer top form additional surface modified regions on surfaces of said copper wires wherein said patterned modified surface region overlaps said regions of said top surfaces of said copper wires.

15. The method of claim 14, wherein said additional surface modified regions are formed using nitrogen or argon as the gas for generating gas clusters.

16. The method of claim 1, wherein said a dielectric layer has a dielectric constant of less than 2.4.

17. The method of claim 1, wherein said atomic layer deposition is performed for one or more deposition cycles.

18. A structure, comprising:
    a dielectric layer of a material having a top surface and a dielectric constant of less than 3;
    a chemically or mechanically modified region of said top surface of said dielectric layer; and
    an electrically conductive thin film on said chemically or mechanically modified region.

19. The structure of claim 18, wherein said electrically conductive thin film is tantalum nitride and has a thickness between 5 Å and 50 Å.

20. The structure of claim 18, wherein dielectric layer has a dielectric constant of less than 2.4.

* * * * *